United States Patent
Schaller et al.

(10) Patent No.: US 10,944,398 B2
(45) Date of Patent: Mar. 9, 2021

(54) SYSTEMS AND METHODS FOR ULTRAFAST PLASMONIC RESPONSE IN DOPED, COLLOIDAL NANOSTRUCTURES

(71) Applicant: UCHICAGO ARGONNE, LLC, Chicago, IL (US)

(72) Inventors: Richard Schaller, Clarendon Hills, IL (US); Benjamin Diroll, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 782 days.

(21) Appl. No.: 15/681,005

(22) Filed: Aug. 18, 2017

(65) Prior Publication Data
US 2018/0097518 A1    Apr. 5, 2018

Related U.S. Application Data
(60) Provisional application No. 62/402,689, filed on Sep. 30, 2016.

(51) Int. Cl.
| | |
|---|---|
| *H03K 17/78* | (2006.01) |
| *B82Y 20/00* | (2011.01) |
| *H01L 51/00* | (2006.01) |

(52) U.S. Cl.
CPC ............. *H03K 17/78* (2013.01); *B82Y 20/00* (2013.01); *H01L 51/00* (2013.01)

(58) Field of Classification Search
CPC ........ H03K 17/78; B82Y 20/00; H01L 51/00; G02B 6/00
USPC .......................................................... 385/16
See application file for complete search history.

(56) References Cited

U.S. PATENT DOCUMENTS

| | | | |
|---|---|---|---|
| 5,521,741 A | 5/1996 | Umezawa et al. | |
| 6,684,003 B2 | 1/2004 | Lipson et al. | |
| 6,782,154 B2 | 8/2004 | Zhao et al. | |
| 8,184,932 B2 | 5/2012 | Digonnet et al. | |
| 8,961,828 B2 | 2/2015 | Buonsanti et al. | |
| 2004/0005723 A1* | 1/2004 | Empedocles | B82Y 30/00 438/1 |
| 2006/0148104 A1* | 7/2006 | Marini | G01N 33/542 436/524 |
| 2009/0020924 A1* | 1/2009 | Lin | B81C 1/00031 264/605 |
| 2009/0061226 A1* | 3/2009 | Banin | C08K 3/22 428/402 |
| 2009/0152664 A1* | 6/2009 | Klem | H01L 27/14641 257/440 |

(Continued)

FOREIGN PATENT DOCUMENTS

| | | |
|---|---|---|
| EP | 0 886 167 A1 | 12/1998 |
| WO | WO-2013/032790 | 12/2013 |

OTHER PUBLICATIONS

"Diroll" et. 'Synthesis of N-Type Plasmonic Oxide Nanocrystals and the Optical and Electrical Characterization of their Transparent Conducting Films', , (CM) Chemistry of Materials al. Published: Jul. 18, 2014 Published: Jul. 18, 2014.*

(Continued)

*Primary Examiner* — Kaveh C Kianni
(74) *Attorney, Agent, or Firm* — Foley & Lardner LLP

(57) ABSTRACT

An article of manufacture comprising doped, colloidal nanostructures that are configured to have a plasmonic response to light of a first resonance wavelength.

9 Claims, 10 Drawing Sheets

(56) References Cited

U.S. PATENT DOCUMENTS

| | | | | |
|---|---|---|---|---|
| 2009/0317802 | A1* | 12/2009 | Bhatia | B82Y 15/00 435/6.11 |
| 2010/0261263 | A1* | 10/2010 | Vo-Dinh | B82Y 30/00 435/287.1 |
| 2010/0285490 | A1* | 11/2010 | Dees | G01N 33/54373 435/7.1 |
| 2011/0021970 | A1* | 1/2011 | Vo-Dinh | A61K 41/0042 604/20 |
| 2011/0075239 | A1 | 3/2011 | Moiseev et al. | |
| 2011/0126889 | A1* | 6/2011 | Bourke, Jr. | H01L 31/055 136/253 |
| 2011/0217544 | A1* | 9/2011 | Young | B29C 37/0032 428/327 |
| 2011/0281070 | A1* | 11/2011 | Mittal | H01L 31/1884 428/142 |
| 2011/0309236 | A1* | 12/2011 | Tian | H01L 27/14687 250/208.1 |
| 2012/0064134 | A1* | 3/2012 | Bourke, Jr. | A61K 8/23 424/401 |
| 2012/0132930 | A1* | 5/2012 | Young | H05K 1/0274 257/84 |
| 2012/0184495 | A1* | 7/2012 | Koyakutty | A61K 49/183 514/19.3 |
| 2013/0281315 | A1* | 10/2013 | Sandros | G01N 33/588 506/9 |
| 2013/0343997 | A1* | 12/2013 | Kennedy | D21H 19/02 424/9.1 |
| 2014/0227548 | A1* | 8/2014 | Myrick | C10L 1/28 428/570 |
| 2015/0238638 | A1* | 8/2015 | Han | C09K 11/025 424/9.6 |
| 2016/0033861 | A1* | 2/2016 | Omenetto | G03F 7/2059 430/272.1 |
| 2016/0082418 | A1* | 3/2016 | Qin | B01J 37/0225 502/330 |
| 2016/0139476 | A1* | 5/2016 | Garcia | G02F 1/133308 359/275 |
| 2017/0222724 | A1 | 8/2017 | Chang et al. | |

OTHER PUBLICATIONS

Diroll, et al., "Synthesis of N-Type Plasmonic Oxide Nanocrystals and the Optical and Electrical Characterization of their Transparent Conducting Films," Chemistry of Materials 26, pp. 4579-4588 (2014).

Gordon, et al., "Shape-Dependent Plasmonic Response and Directed Self-Assembly in a New Semiconductor Building Block, Indium-Doped Cadmium Oxide (ICO)," Nano Letters 13, pp. 2857-2863 (2013).

Guo, et al., "Ultrafast switching of tunable infrared plasmons in indium tin oxide nanorod arrays with large absolute amplitude," Nature Photonics 10, pp. 267-274 (2016).

Kinsey, et al., "Epsilon-near-zero Al-doped ZnO for ultrafast switching at telecom wavelengths," Optica 2(7), pp. 616-622 (2105).

Tice, et al., "Ultrafast Modulation of the Plasma Frequency of Vertically Aligned Indium Tin Oxide Rods," Nano Letters 14, pp. 1120-1126 (2014).

Ye, et al., Expanding the Spectral Tunability of Plasmonic Resonances in Doped Metal-Oxide Nanocrystals through Cooperative Cation-Anion Codoping, Journal of the American Chemical Society 136, pp. 11680-11686 (2014).

Buonsanti, et al., "Tunable Infrared Absorption and Visible Transparency of Colloidal Aluminum-Doped Zinc Oxide Nanocrystals," Nano Letters 11(11), pp. 4706-4710 (2011).

Kanehara, et al., "Indium Tin Oxide Nanoparticles with Compositionally Tunable Surface Plasmon Resonance Frequencies in the Near-IR Region," Journal of the American Chemical Society 131(49), pp. 17736-17737 (2009).

* cited by examiner

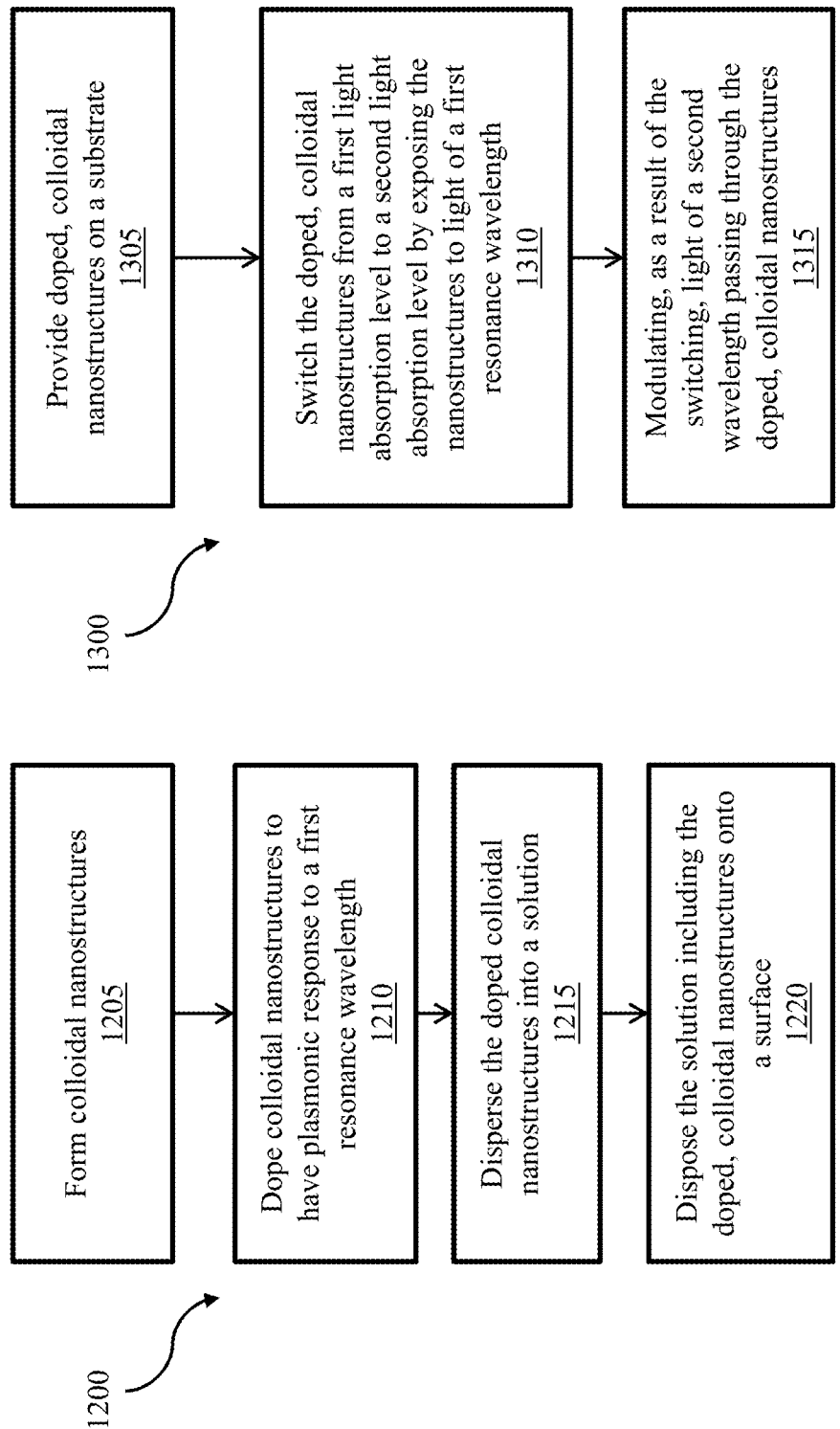

SYSTEMS AND METHODS FOR ULTRAFAST PLASMONIC RESPONSE IN DOPED, COLLOIDAL NANOSTRUCTURES

CROSS-REFERENCE TO RELATED APPLICATIONS

This application claims the benefit of U.S. Provisional Patent Application No. 62/402,689 filed Sep. 30, 2016, the content of which is herein incorporated by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to systems and methods for colloidal nanostructures. More specifically, for systems and methods for utilizing the plasmonic response of doped, colloidal nanostructures.

BACKGROUND

Switches are important communications, electricity, and other uses. For example, a simple electrical switch can be a pair of wires that can be separated or put in contact to be off or on, respectively. In an all-electrical switch, electrical signals are used to open or close the switch. An all-optical switch controls optical signals (light) with an optical signal used to open or close the switch.

Electrical switches can be used to turn appliances on and off electronically and can be used to direct electronic signal-streams around a network. All-electrical switches like the transistor are used as a building block for digital logic circuits. The two states of a switch (on and off) can be used as a physical representation of the binary integers or logic levels (0 and 1) and that logic rules used for computation can be implemented all-electronically because the state of the switch is controlled by another electrical signal.

Similarly, all-optical switches can fulfill some of the same functions as all-electronic switches, e.g. direct signal-streams around optical networks or serve as building blocks for optical computers. For example, all-optical switches may be used in communications, because long-distance telephone and internet communication can be carried out on optical fibers, allowing information to travel long distances at nearly the speed of light.

SUMMARY

Some embodiments described herein relate to an article of manufacture comprising doped, colloidal nanostructures that are configured to have a plasmonic response to light of a first resonance wavelength.

Some embodiments described herein relate to a method of forming doped, colloidal nanostructures by forming colloidal nanostructures and doping the colloidal nanostructures. The doped, colloidal nanostructures are configured to have a plasmonic response to light of a first resonance wavelength.

Some embodiments described herein relate to a method of optical switching using doped, colloidal nanostructures. The method includes providing doped, colloidal nanostructures on a substrate. The method further includes switching the doped, colloidal nanostructures from a first light absorption level to a second light absorption level by exposing the doped, colloidal nanostructures to light of a first resonance wavelength. The method further includes modulating, as a result of the switching, light of a second wavelength passing through the doped, colloidal nanostructures.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 12 is a schematic flow diagram for a method of forming doped, colloidal nanostructures.

FIG. 13 is a schematic flow diagram for a method of modulating a signal using a doped colloidal nanostructure as an optical switch.

Figure 1:
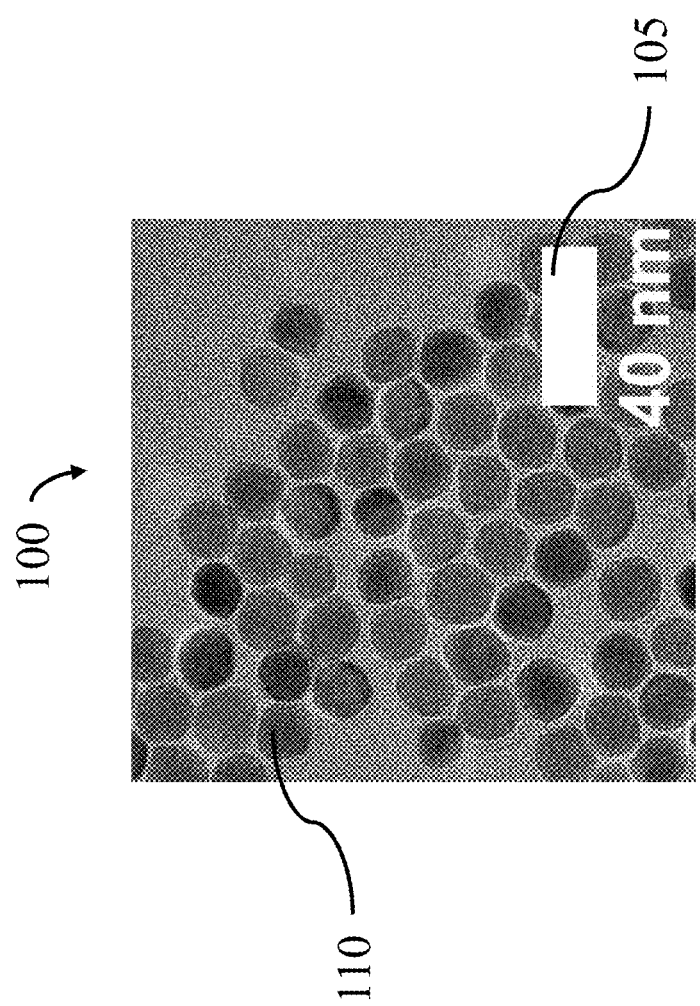
FIG. 1 illustrates a photograph of colloidal nanostructures.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and methods for colloidal nanostructures. Some embodiments specifically relate to systems and methods for utilizing the plasmonic response of doped, colloidal nanostructures. Colloidal nanostructures are those that comprise a mixture in which one substance of microscopically dispersed insoluble particles is suspended throughout another substance Doped, colloidal nanostructures as disclosed herein can provide an all-optical switch that possesses ultrafast switching capabilities (in approximately 1 picosecond (ps) or less) without excessive heating. A plasmonic response of the doped, colloidal nanostructures to a particular wavelength or range of wavelengths of light causes the doped, colloidal nanostructures to be either more or less absorptive of other light. Accordingly, the doped, colloidal nanostructures can be used as an optical switch to control or modulate how a signal is generated or otherwise passed through the doped, colloidal nanostructures.

Although optical fibers are used to transmit data, signals passed over optical fibers are often turned from light into electricity so that an electronic device can read the data. Converting signals from light to electricity and from electricity to light uses power, generates heat, and has inherent loss. Accordingly, such conversions can be costly (with respect to money and/or system resources), particularly if a system does such conversions quickly and/or many times in a row. Disclosed herein are systems and methods of doped, colloidal nanostructures that can be used as optical switches, decreasing the need to convert such signals between optical and electrical signals. In other words, the all-optical switches disclosed herein may be used in all-optical computing and/or communications systems and methods.

All-optical computing and communications can have advantages utilizing the all-optical switches disclosed herein may have smaller size, higher density, higher speed, and/or lower heating of junctions and substrates than an all-electrical or hybrid electrical/optical systems.

Optical communications, and particularly optical switching, materials should be capable of rapid, large, and high-fidelity modulation of transmitted or reflected light (i.e. refractive indices) with fast switching speeds, ideally with minimal energy use for their control and capable of integration with other technology platforms. The doped, colloidal nanostructures disclosed herein include many advantages for optical switching embodiments and uses. Some methods and systems for using optical switching are described in U.S. Provisional Patent Application No. 62/290,908, filed on Feb. 3, 2016 and incorporated herein by reference in its entirety. Accordingly, disclosed herein are doped, colloidal nanostructures (or nanocrystals), which can be used in all-optical switches because of their large interactions with, for example, infrared light. These optical switches are tunable by chemical methods. In other words, they can be tuned to specific wavelength ranges depending on the specific type of colloidal nanostructures and the type and amount of dopant(s) present. The doped, colloidal nanostructures are also advantageously compatible with many low-cost deposition methods. The doped, colloidal nanostructures demonstrate a large modulation of transmittance and subpicosecond return to original transmission properties. Thus, the doped, colloidal nanostructures disclosed herein can be used as efficient all-optical switches and/or modulators. In other words, the doped, colloidal nanostructures disclosed herein provide rapid, high-fidelity modulation of light controlled by an optical gate. The doped, colloidal nanostructures can be stored or applied to a substrate in a solution (the doped, colloidal nanostructures are solution-dispersible). In addition, the doped, colloidal nanostructures disclosed herein offer a high level spectral control of a modulated wavelength depending on the design of the doped, colloidal nanostructures.

The doped, colloidal nanostructures disclosed herein can be utilized based on their plasmonic response to particular wavelengths of light. In particular, doped, plasmonic nanocrystals or nanostructures can be used for ultrafast all-optical switching. In some embodiments, the ultrafast all-optical switching may utilize light in the infrared spectrum. In some embodiments, other or additional spectrums/wavelengths of light may be utilized, such as ultraviolet and/or visible light. The embodiments disclosed herein are capable of using one beam of light to gate the transmittance and index of refraction of the materials disclosed herein on the scale of 1 picosecond (ps) or less. In some embodiments, the gating or switching may occur anywhere between 0.25 and 3 picoseconds. That is, the transmittance (or light absorption in the converse) of an all-optical switch as disclosed herein is altered and then returned to a previous state before being altered in very short amount of time, allowing for its use in high-fidelity contexts. For example, such switching may occur within 0.25 ps, 0.5 ps, 0.75 ps, 1 ps, 1.25 ps, 1.5 ps, 1.75 ps, 2 ps, 2.25 ps, 2.5 ps, 2.75 ps, or 3 ps depending on the embodiment, the length exposure to the light (pulse) used to gate the switch, the material selected to form the colloidal nanostructures, the material used to dope the colloidal nanostructures, and/or the amount of material used to dope the colloidal nanostructures. The large amplitude changes (i.e. return to static properties) in short amounts of time allow for high fidelity (low loss) systems to be constructed with the switches disclosed herein.

As discussed herein, the all-optical switches disclosed can be tuned to yield narrowband switches. Such switches may be helpful in wavelength division multiplexing (WDM) and/or dense wavelength division multiplexing (DWDM) applications, as a large number of switches can be formed that are tuned to different bands of frequency used to transmit signals in WDM and DWDM applications. Therefore, the spectral tunability and spectral sharpness of the systems and methods disclosed herein are advantageous for multi-modal processing. In addition, the switches disclosed herein are advantageously angle-insensitive. That is, the transmittance or light absorbing properties of the all-optical switches disclosed herein are not dependent on an orientation or angle of the beam being used to gate the switch, the signal being switched, or the switch itself. The doped, colloidal nanostructures that can be used as all-optical switches are also liquid-dispersible. Accordingly, the doped, colloidal nanostructures can be dispersed into a solution, allowing them to be applied to and compatible with arbitrary substrates or form factors, as disclosed herein.

Doped, colloidal nanostructures, such as colloidal oxide nanocrystals doped with aliovalent dopants, are shown herein to interact strongly with light at infrared wavelengths because of localized surface plasmon resonances of the doped, colloidal nanostructures. Such doped, colloidal nanostructures can include but are not limited to aluminum-, gallium-, and indium-doped zinc oxide; tin- and antimony doped indium oxide; tin-, aluminum-, gallium-, indium-, and fluorine-doped cadmium oxide; co-doped samples; and any combinations of the foregoing.

The wavelength of the plasmon resonance can be tuned throughout infrared wavelengths in wet chemical synthesis of the nanocrystals by addition of dopant species, according to established synthetic methods. For example, the synthesis of such nanocrystals may occur according to the processes described in B. T. Diroll, T. R. Gordon, E. A. Gaulding, D. R. Klein, T. Paik, H. J. Yun, E. D. Goodwin, D. Damodhar, C. R. Kagan, C. B. Murray. *Chemistry of Materials*, 2014, 26 (15), pp 4579-4588; T. R Gordon, T. Paik, D. R. Klein, G. J. Naik, H. Cagalayan, A. Boltasseva, C. B. Murray. *Nano Letters*, 2013, 13 (6), pp 2857-2863; X. Ye, J. Fei, B. T. Diroll, T. Paik, C. B. Murray. *Journal of the American Chemical Society*, 2014, 136 (33), pp 11680-11686; M. Kanehara, H. Koike, T. Yoshinaga, T. Teranishi. *Journal of the American Chemical Society*, 2009, 131 (49), pp 17736-17737; or R. Buonsanti, A. Llordes, S. Aloni, B. Helms, D. J. Milliron. *Nano Letters*, 2011, 11 (11), pp 4706-4710. The colloidal synthesis of these materials enables largescale production without high temperature or high vacuum technologies. Furthermore, dispensability in colloidal solution enables printing, spray-coating, spin-coating, dip-coating and similar techniques, which are compatible with large-area, conformal deposition at low cost on to arbitrary substrates, including flexible plastics. For example, the colloidal particles disclosed herein are easily dispersible as inks or paints. Therefore, they offer flexibility in applications, allowing them to be printed, spray-coated, spin-coated, zone-casted, dip-coated, etc. onto samples of arbitrary substrates, including even flexible substrates, such as plastics. Other application methods to a substrate can include roll-to-roll, printing, spray-casting, and conformal deposition on to any substrates, including plastics. In addition, the materials disclosed that can form all-optical switches can exist and function at room-temperature, allowing for savings in environmental controls for all-optical switches.

In one specific example, when doped, colloidal nanostructures were excited at the wavelength of the plasmon resonance for those particular doped, colloidal nanostructures, a large (up to 87% measured relative increase in transmittance; 20% absolute transmittance increase) modulation of transmittance at the resonance wavelength was shown using control fluences of <5 milliJoules per centimeter squared (mJ/cm$^2$). In various embodiments, relative changes in transmission and/or index of refraction between 0.1-1000% may be realized. As examples, relative changes such as 0.1%, 0.5%, 1%, 2%, 5%, 10%, 15%, 20%, 30%, 40%, 50%, 60%, 70%, 80%, 90%, 100%, 150%, 200%, 250%, 300%, 350%, 400%, 450%, 500%, 600%, 700%, 800%, 900%, and 1000% are contemplated. In addition to large modulation, the doped, colloidal nanostructures show high fidelity of optical switching: >95% of the original absorption is recovered within 1 ps in this example. Therefore, when operated as an optical switch, terahertz (THz) frequencies are achievable, which makes the switches useful for high frequency modulation applications. Accordingly, doped oxide colloidal nanocrystals could be used in all-optical computing, switching, and/or communications applications. The doped, colloidal nanostructures disclosed herein may also be formed to act as transistors, and may be used in optical computing applications. Some embodiments can also exhibit electrochromism properties from charge injection excitation. In addition, some embodiments may include more than one mode of operation. For example, doped, colloidal nanostructures may be excited in ultraviolet (with, e.g., a 10 ps response), and may be excited on resonance with the plasmon (on the order of 1 ps response), as disclosed herein.

Advantageously, the materials disclosed herein provide a large magnitude of observed changes, allowing for high fidelity of switching and high speed of switching. Picosecond and sub-picosecond time-scale response of any of the disclosed doped, colloidal nanoparticles that show localized surface plasmons offer improvements for switching generally and all-optical switching specifically. Accordingly, an all-optical logic gate/switch constructed from colloidal doped oxide nanocrystals can be used in optical communications and computing systems. For example, perpendicular gate and control beams can be constructed. Beam steering from periodic structures embodiments are also contemplated. The switches disclosed herein can also be constructed in parallel or series. In various embodiments, the switches disclosed herein can be tunable to a wavelength or wavelength band/range of interest, including, for example, telecommunications wavelength at 1.5 microns (1500 nanometers (nm)). In other examples, wavelengths may be tuned between 1500-5000 nanometers. Other wavelengths are also contemplated herein. For example, the doped, colloidal nanostructures disclosed herein may be synthesized and tuned to be responsive to light of wavelengths from 1000 nm to 10,000 nm. As examples, doped, colloidal nanostructures as disclosed herein may be responsive to light of wavelengths 1000 nm, 1200 nm, 1400 nm, 1600 nm, 1800 nm, 2000 nm, 2200 nm, 2400 nm, 2600 nm, 2800 nm, 3000 nm, 3200 nm, 3400 nm, 3600 nm, 3800 nm, 4000 nm, 4200 nm, 4400 nm, 4600 nm, 4800 nm, 5000 nm, 5200 nm, 5400 nm, 5600 nm, 5800 nm, 6000 nm, 6200 nm, 6400 nm, 6600 nm, 6800 nm, 7000 nm, 7200 nm, 7400 nm, 7600 nm, 7800 nm, 8000 nm, 8200 nm, 8400 nm, 8600 nm, 8800 nm, 9000 nm, 9200 nm, 9400 nm, 9600 nm, 9800 nm, or 10,000 nm.

FIG. 1 illustrates a photograph 100 of colloidal nanostructures. The photograph 100 shows a scale 105 and an example nanostructure 110.

Figure 2:
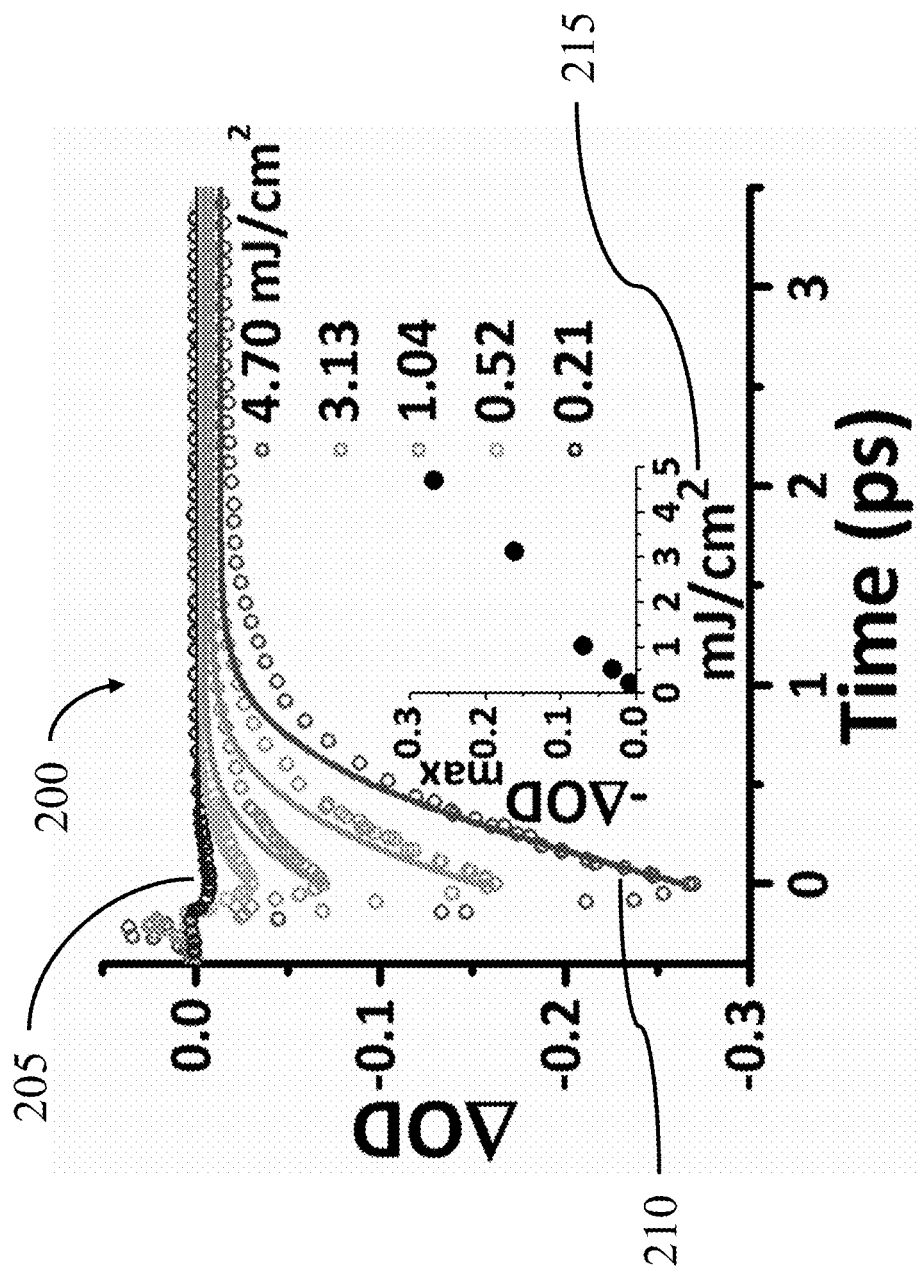
FIG. 2 is a graph illustrating the change in light absorption over time of illustrative doped, colloidal nanostructures when exposed to different intensities of light.

FIG. 2 is a graph 200 illustrating the change in light absorption over time of illustrative doped, colloidal nanostructures when exposed to different intensities of light. Doped semiconductor nanocrystals show localized surface plasmon resonances in the infrared, tunable depending on the doping level. Masses of dopants may vary, for example, between 0.1-35% by mass of the doped, colloidal nanostructures. Specific percentages of dopants may include approximately 0.1, 0.25, 0.5, 0.75, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35% dopants by mass of the doped, colloidal nanostructures.

The graph 200 shows a line 205 and a line 210 that correspond to a change in absorption over time when doped, colloidal nanostructures are exposed to a beam of a particular wavelength that elicits a plasmonic response. Other lines are shown in the graph 200, but the line 205 and the line 210 will be discussed as examples. The different lines refer to different intensities of the beam used to elicit the plasmonic response from the doped, colloidal nanostructures. In particular, the line 205 represents a 0.21 mJ/cm$^2$ beam and the line 210 represents a 4.70 mJ/cm$^2$ beam. The y-axis demonstrates the change in absorption of light over time (the x-axis) as a pulse of the respective intensities is used to switch the doped, colloidal nanostructures. As shown in the graph 200, the line 210 has a larger change in absorption because of the larger intensity of the beam, while the line 205 has a smaller change in absorption. The other lines show other intermediate changes in absorption depending on their respective intensities. The potential for change in absorption of the doped, colloidal nanostructures is shown as a function of intensity in the inset graph 215. Each of the lines returns substantially to their original state of absorption within approximately 1 ps. Accordingly, different intensity beams may be used with doped, colloidal nanostructures depending on the change in absorption needed to properly switch/modulate a signal (i.e., achieve the necessary fidelity). Therefore, the intensity of the signal may be optimized to reduce energy needed to pulse or switch the doped, colloidal nanostructures, and further reducing heat produced by the switch as evident by FIG. 3 discussed below.

Figure 3:
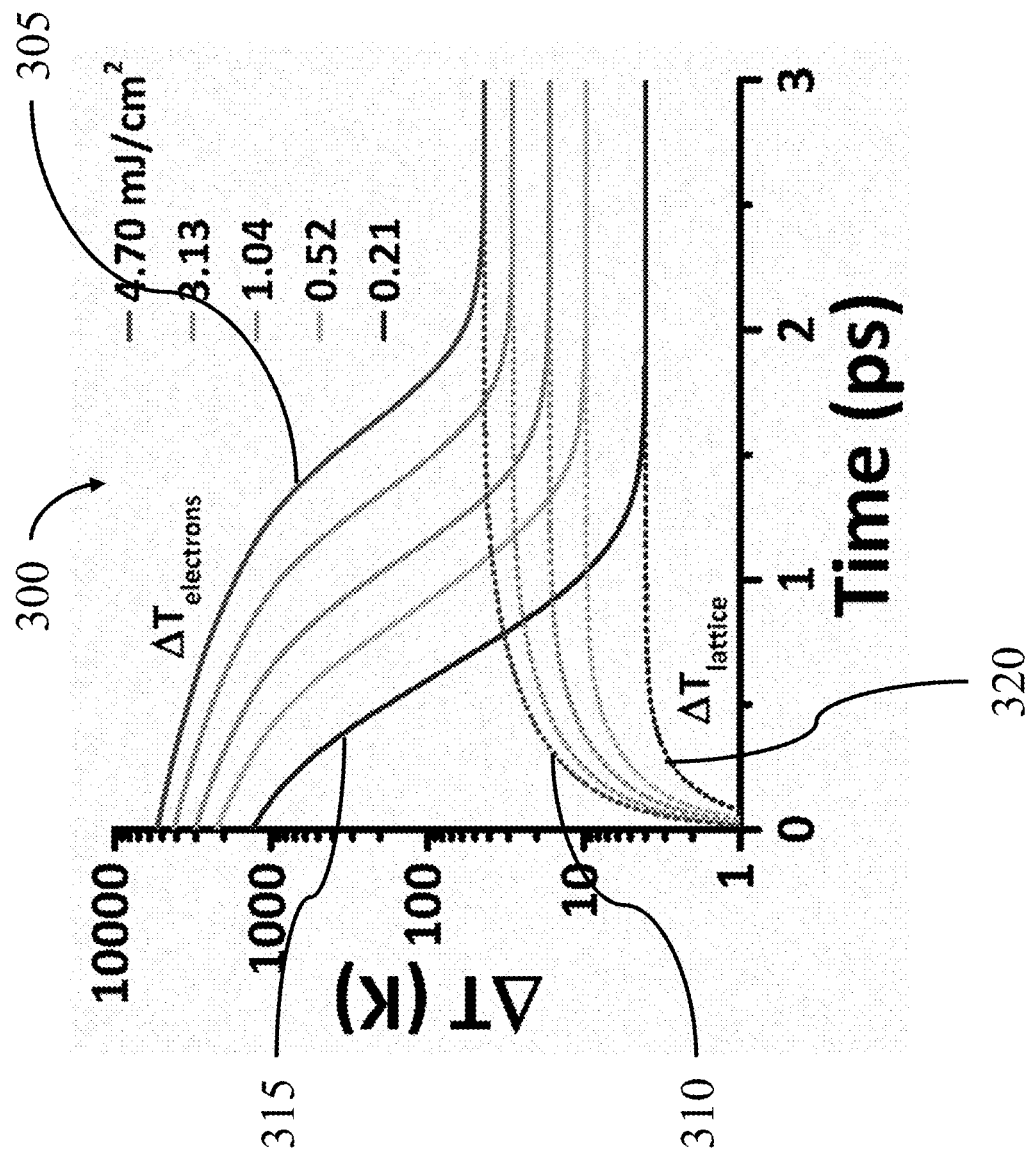
FIG. 3 is a graph illustrating the change in temperature over time of electrons/charge carriers in illustrative doped, colloidal nanostructures when exposed to different intensities of light.

FIG. 3 is a graph 300 illustrating the change in temperature over time of electrons/charge carriers in illustrative doped, colloidal nanostructures when exposed to different intensities of light. The graph 300 again shows multiple lines relating to different intensities of light be used to elicit a plasmonic response from doped, colloidal nanostructures. Lines 305 and 310 are associated with a 4.70 mJ/cm$^2$ beam and lines 315 and 320 are associated with a 0.21 mJ/cm$^2$ beam. Again, similar to the graph 200, the intermediate lines show intensities of beams between those two values.

The lines 305 and 315 show the cooling of electrons in the doped, colloidal nanostructures as the doped, colloidal nanostructures return to normal after a pulse or beam is applied to switch the doped, colloidal nanostructures. The lines 310 and 320 show the associated heating of the lattice of the doped, colloidal nanostructures that occurs as heat is released from the electrons. As shown in the graph 300, the heat added to the lattice is not excessive, allowing switches as disclosed herein to operate with little or no cooling systems in room-temperature applications.

Other systems that do not use the doped, colloidal nanostructures disclosed herein may have substantially more heating than that shown in the graph 300. The systems disclosed herein advantageously have lower heating because of low electron heat capacity and non-parabolicity of the conduction band of the doped, colloidal nanostructures. The systems and methods disclosed herein have higher fidelity than other metal nanostructures, because the doped, colloidal nanostructures disclosed herein have smaller electron heat capacity (by, e.g., at least 10× compared to other metal nanostructures) and conduction band non-parabolicity. Therefore, an equivalent input of energy yields a larger signal for equivalent amount of heating of the nanostructure. The result is that a ratio of the peak signal versus the signal at long time after the light exposure (e.g. 100 picoseconds) is much larger (10-100 times greater) in doped, colloidal nanostructures than other metallic nanostructures. Therefore, the systems and methods disclosed herein can advantageously operate with high fidelity, meaning large light-on/light-off ratio, at a much higher repetition frequency than possible in metallic nanostructures.

Figure 4B:
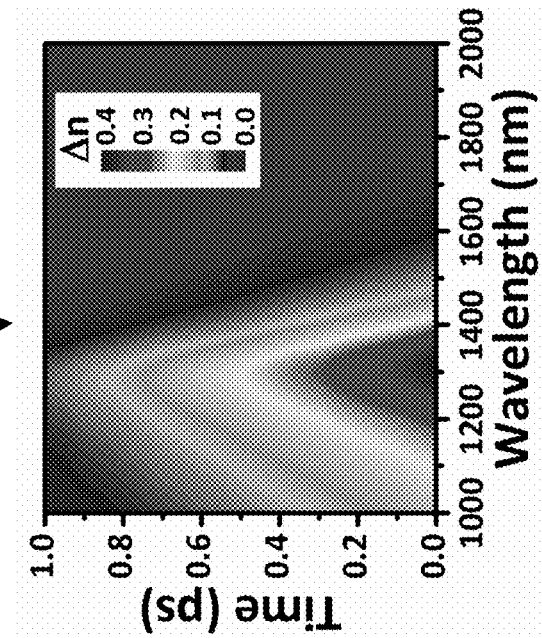
FIG. 4B is a graph illustrating a change in index of refraction over time of illustrative doped, colloidal nanostructures when exposed to different wavelengths of infrared light.
Figure 4A:
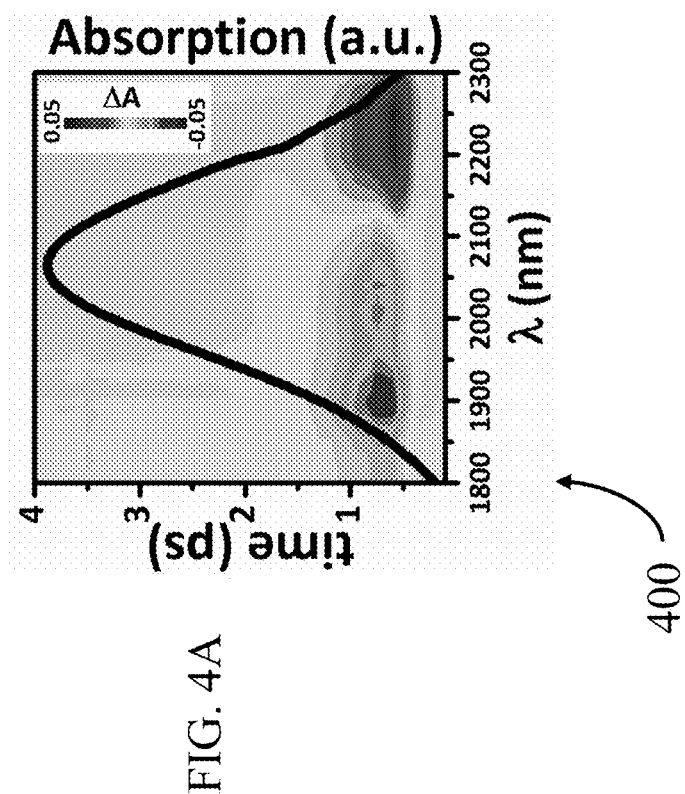
FIG. 4A is a graph illustrating the change in light absorption over time of illustrative doped, colloidal nanostructures when exposed to different wavelengths of infrared light.

FIG. 4A is a graph 400 illustrating the change in light absorption over time of illustrative doped, colloidal nanostructures when exposed to different wavelengths of infrared light. Wavelength tunability, optical response have been demonstrated for a subset of the materials claimed (CdO-based materials and doped indium oxide); other oxide materials have not been demonstrated, but known properties strongly suggest that they will also be useful in the same application. These materials have not been implemented in a device. The graph 400 shows how the switches herein may be configured to modulate light be blocking (absorbing) light when switched on, or by transmitting (not absorbing) light when switched on. For example, the doped, colloidal nanostructures that are used to generate the graph 400 show a strong negative change in absorption when exposed to a wavelength of about 1900 nm and a strong positive change in absorption when exposed to a wavelength of about 2200-2300 nm. Accordingly, the doped, colloidal nanostructures may be used in different applications. Additionally, note in the graph 400 that, like in FIG. 2, the absorption largely returns to an original state after approximately 1 ps. The parabolic curve in FIG. 4A shows the steady state (time independent) absorption signal of the same sample on an arbitrary scale. That is, it shows the region of wavelengths where a switching features is expected for the particular example of doped, colloidal nanostructures tested for FIG. 4A.

FIG. 4B is a graph 450 illustrating a change in index of refraction over time of illustrative doped, colloidal nanostructures when exposed to different wavelengths of infrared light. In the graph 450, the doped, colloidal nanostructures exhibits a strong change in index of refraction when exposed to light with a wavelength of about 1300 nm. In addition, the doped, colloidal nanostructures exhibit significant changes in index of refraction when exposed to light with wavelengths ranging from 1000 nm to 1500 nm. In addition to the change in transmittance, the change in index of refraction of doped, colloidal nanostructures can also be utilized to implement all-optical switches. For example, when the doped, colloidal nanostructures of FIG. 4B are exposed to light at 1300 nm, the doped, colloidal nanostructures will undergo a significant change in index of refraction. Accordingly, a signal of light that is being modulated or switched may be affected by the change in index of refraction. For example, the all-optical switch may have transmitted the signal prior to being exposed to the 1300 nm wavelength light, but during the time of the exposure, the signal reflects off of the doped, colloidal nanostructures as a result of the change in index of refraction. Thus, an all-optical switch can be effected.

Figure 5:
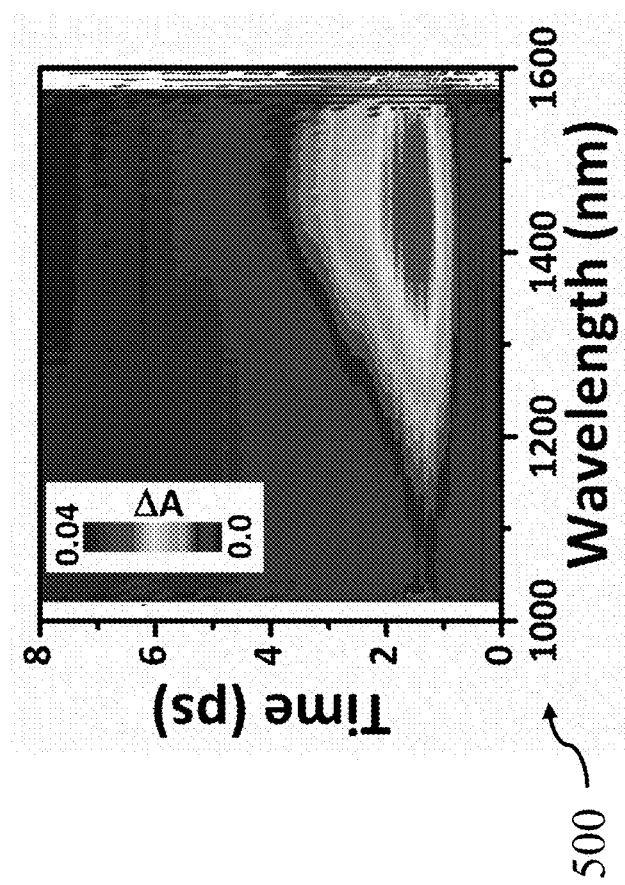
FIG. 5 is a graph illustrating the change in light absorption over time of illustrative doped, colloidal nanostructures when exposed to different wavelengths of ultraviolet light.

FIG. 5 is a graph 500 illustrating the change in light absorption over time of illustrative doped, colloidal nanostructures when exposed to different wavelengths of ultraviolet light. The graph 500 shows an example of a high change in absorbance for a wavelength range of approximately 1300-1600 nm. Such an embodiment may be useful, for example, in telecommunications applications. Advantageously, the response or change in absorbance of the doped colloidal nanostructures in response to ultraviolet light shown in FIG. 5 gives the possibility of multiple uses of the same optical switches in different frequency bands.

Figure 6:
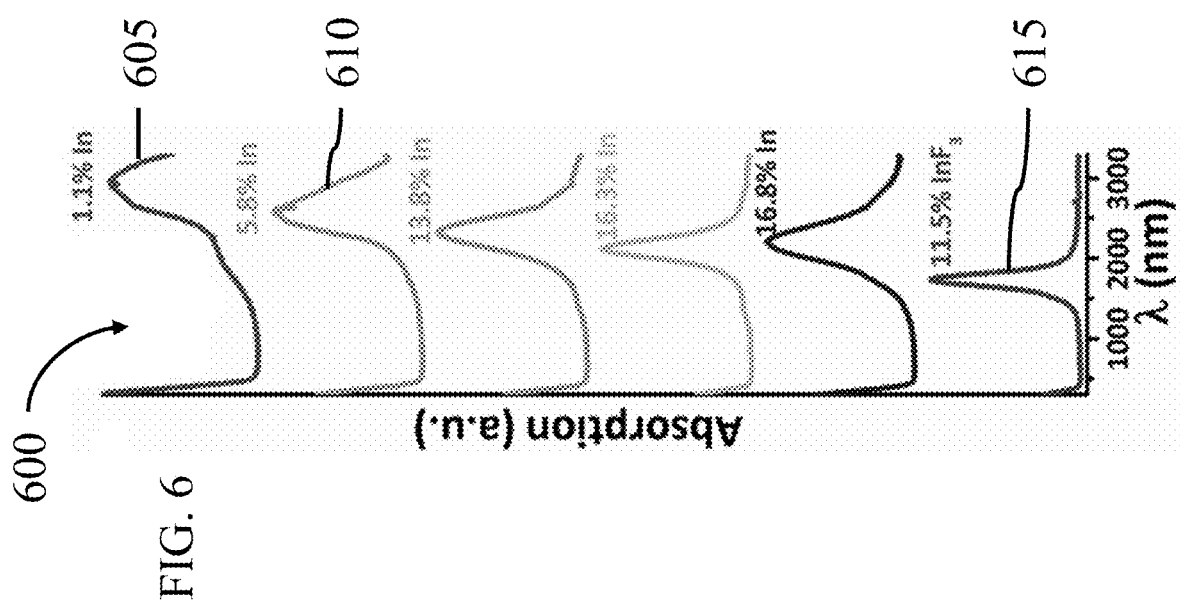
FIG. 6 is a graph illustrating the absorption of light at different lengths for several illustrative embodiments of doped, colloidal nanostructures that are doped with different materials and different percentages of dopants.

FIG. 6 is a graph 600 illustrating the absorption of light at different lengths for several illustrative embodiments of doped, colloidal nanostructures that are doped with different materials and different percentages of dopants. The graph 600 demonstrates how doped, colloidal nanostructures may be tuned for different particular wavelengths, including monochromatic wavelength ranges.

For example, a line 605 shows the absorption change for doped, colloidal nanostructures that are doped with 1.1% indium. The change in absorption for the line 605 is shown at a relatively high (approximately 3000 nm) wavelength. A line 610 shows absorption for doped, colloidal nanostructures that are doped with 5.8% indium. The line 610 has a lower wavelength associated with its peak absorption change as compared to the line 605. In another example, a line 615 is doped with 11.5% indium fluoride ($InF_3$), and has a peak absorption change between 1500 and 2000 nm. Accordingly, the doped, colloidal nanostructures can be formed in such a way as to tune the doped, colloidal nanostructures to particular wavelengths of light so that different switches may be controlled by different signals of different wavelengths.

Figure 7:
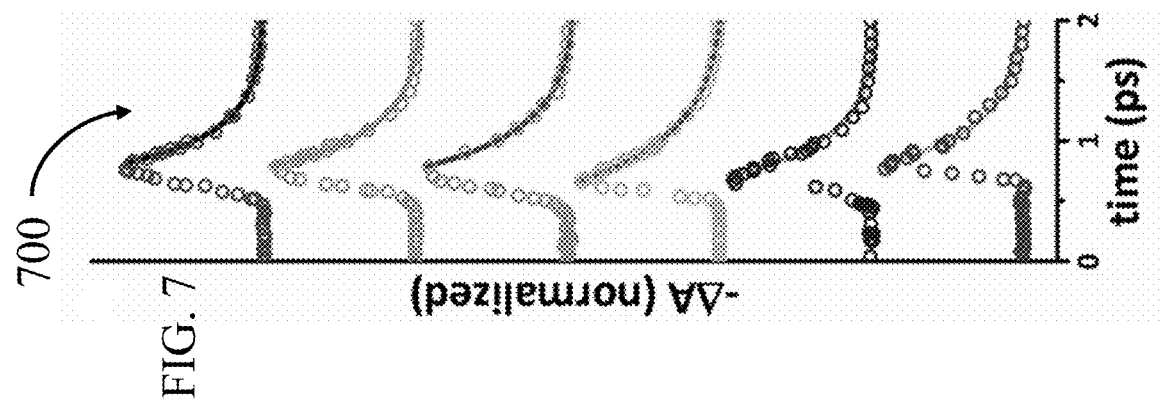
FIG. 7 is a graph illustrating the change in light absorption over time of the illustrative embodiments doped with different materials and different percentages of dopants as shown in FIG. 6.

FIG. 7 is a graph 700 illustrating the change in light absorption over time of the illustrative embodiments doped with different materials and different percentages of dopants as shown in FIG. 6. The graph 700 shows a normalized change in absorption over time for the lines shown in the graph 600 when the various doped, colloidal nanostructures are pulsed with a beam of light according to their optimal, tuned wavelengths. The graph 700 shows that the switching response can be less than 1 ps for each of the different doped, colloidal nanostructures, as disclosed herein.

Figure 8:
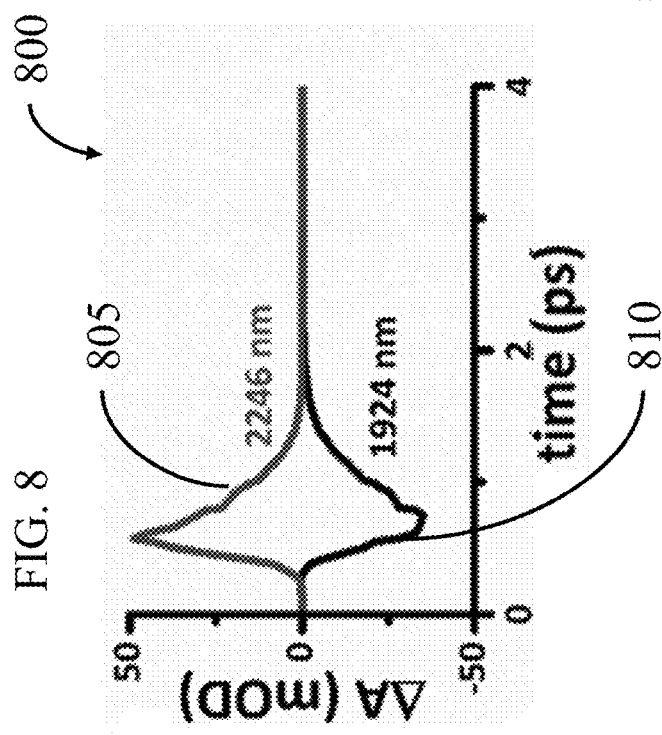
FIG. 8 is a graph illustrating the change in light absorption over time of two different wavelengths of light according to the illustrative embodiment shown in FIG. 4A.

FIG. 8 is a graph 800 illustrating the change in light absorption over time of two different wavelengths of light according to the illustrative embodiment shown in FIG. 4A. The graph 800 shows a line 805 and a line 810 that correspond to the different positive and negative absorption change ranges shown in the graph 400. The line 805 shows that a wavelength of 2246 nm will cause a positive change in absorption, while the line 810 with a wavelength of 1924 will cause a negative change in absorption over the time of about 1 ps.

Figure 9:
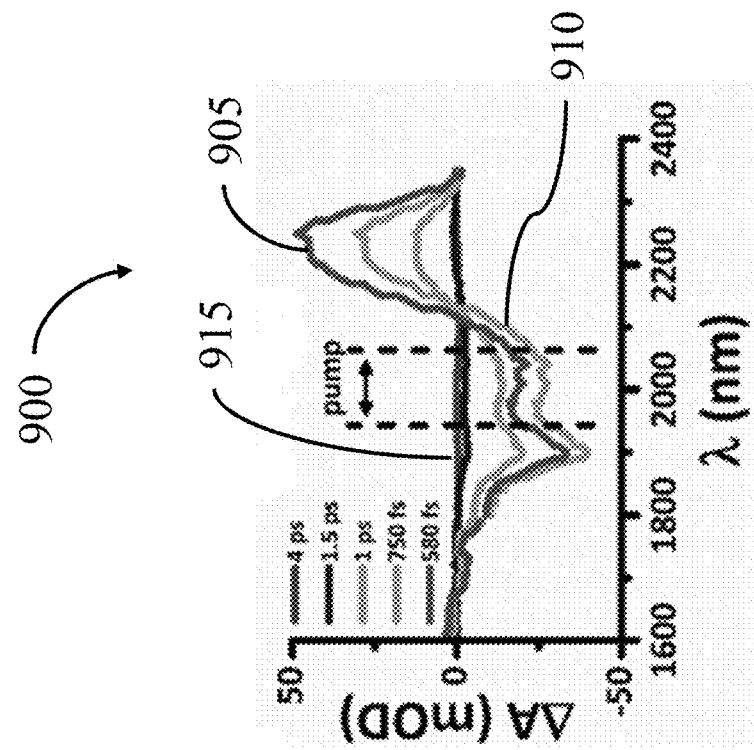
FIG. 9 is a graph illustrating the change in light absorption of various wavelengths of light at particular times according to the illustrative embodiment shown in FIG. 4A.

FIG. 9 is a graph 900 illustrating the change in light absorption of various wavelengths of light at particular times according to the illustrative embodiment shown in FIG. 4A. The graph 900 shows that at different times, the change in absorption for pulses of different wavelengths can vary. The graph 200 similarly shows this phenomena in a different way. In other words, the graph 900 shows that at different wavelengths, the change in absorption may be high soon after the pulse, for example as shown by lines 905 at 580 ficoseconds (fs) or line 910 at 750 fs. Note that different wavelengths may respond differently as a function of time: the change in absorption for a 2000 nm wave is higher at 750 fs than at 580 fs, while the change in absorption for a 2250 nm wave is higher at 580 fs than at 750 fs. In contrast, the change in absorption for a line 915 shows that at 4 ps, shows that any change in absorption is almost zero regardless of the wavelength used to pulse the doped, colloidal nanostructures.

Figure 10:
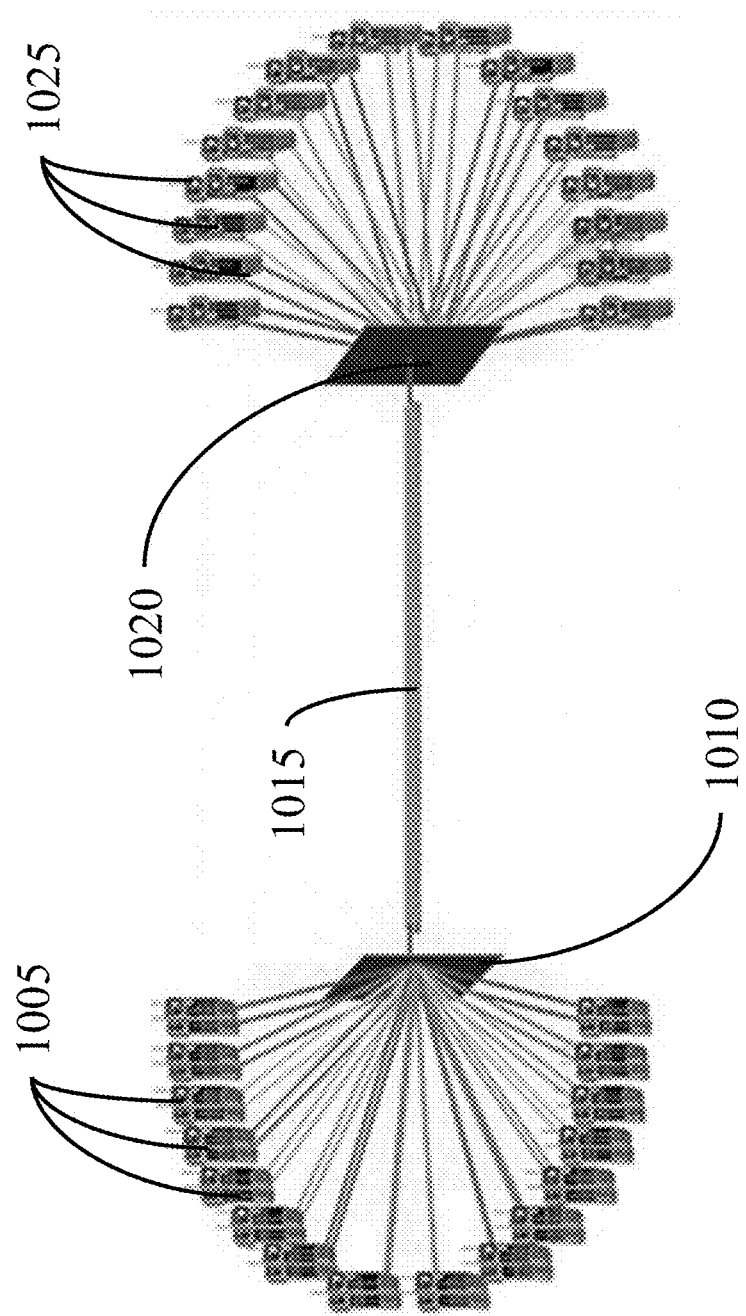
FIG. 10 shows an example of wavelength division multiplexing (WDM) in which the doped, colloidal nanostructures disclosed herein may be used as optical switches.

FIG. 10 shows an example of wavelength division multiplexing (WDM) in which the doped, colloidal nanostructures disclosed herein may be used as optical switches. FIG. 10 shows that multiple devices 1005, may generate signals using the optical switches/modulators disclosed herein. Different optical switches that modulate signals according to different wavelengths may be used, such that they can be multiplexed by a multiplexer 1010 and passed through a fiber optic cable 1015 and de-multiplexed at a de-multiplexer 1020. The signals can then be sent to multiple devices 1025 so that the signals can be read. Such signals may be read and interpreted using optical switches as disclosed herein. In some embodiments, the optical switches disclosed herein may also be used to multiplex or de-multiplex the signals at the multiplexer 1010 and/or the de-multiplexer 1020, as discussed further below. All-optical switches as disclosed herein may also be used in certain applications between multiplexing and de-multiplexing in some WDM embodiments.

Figure 11:
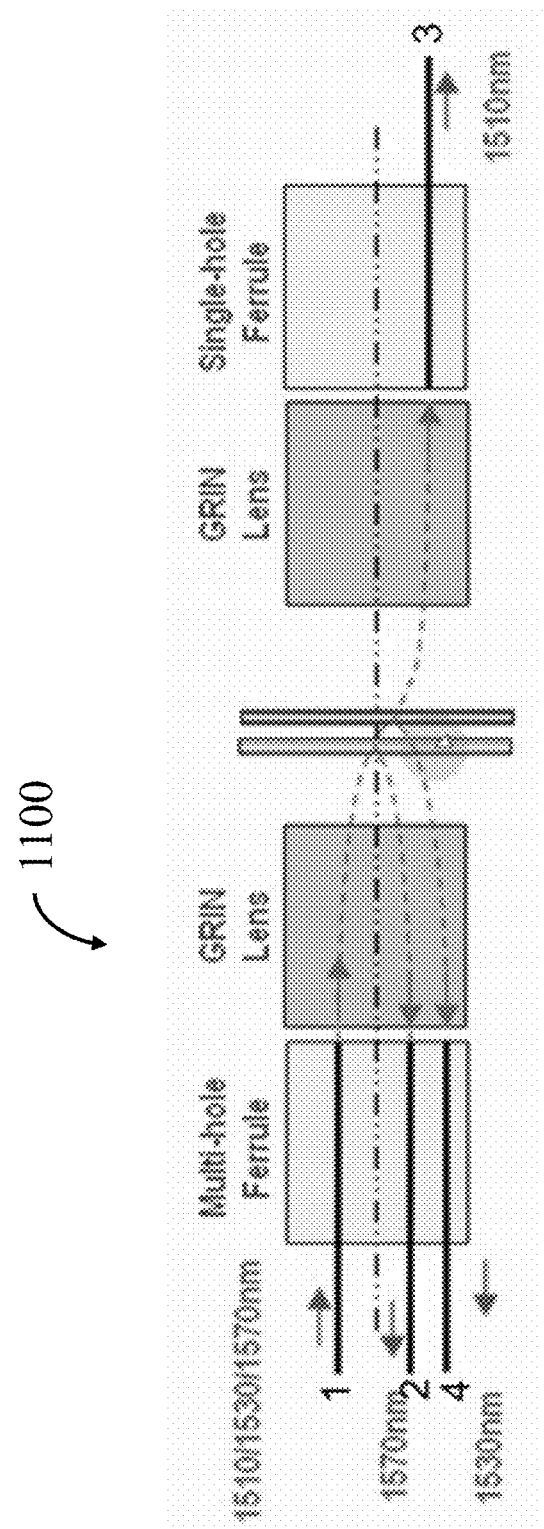
FIG. 11 shows an example of thin-film filters (TFFs) that may be used to de-multiplex an optical signal.

FIG. 11 shows an example of thin-film filters (TFFs) that may be used to de-multiplex an optical signal. FIG. 11 shows a de-multiplexer, such as the de-multiplexer 1025 of FIG. 10, that may be used to separate out signals that have been multiplexed. TFFs are cascaded to filter out one frequency band at a time until each frequency band is filtered. Optical switches as disclosed herein may be used similar to the filters shown in FIG. 11. For example, multiple tuned doped, colloidal nanostructures may be used as switches to read a multi frequency signal, by having an all-optical switch tuned to each frequency present in the multiplexed signal. In this way, the optical switches can de-multiplex a signal by modulating a signal based on the particular frequencies present in a multiplexed signal.

FIG. 12 is a schematic flow diagram 1200 for a method of forming doped, colloidal nanostructures. In an operation 1205, colloidal nanostructures are formed. In an operation 1210, the colloidal nanostructures are doped. In some embodiments, the colloidal nanostructures are formed at the same time the colloidal nanostructures are doped. The doped, colloidal nanostructures are configured to have a plasmonic response to light of a first resonance wavelength, as disclosed herein. As described herein throughout, the first resonance wavelength may be tuned by the material used for the nanostructures and/or the dopants, as well as the percentage of dopants used.

In an operation 1215, the doped, colloidal nanostructures are dispersed into a solution. In an operation 1220 the doped, colloidal nanostructures are disposed onto a surface by disposing the solution onto the surface. The solution may also be sprayed, rolled, printed, etc. onto a substrate as disclosed herein.

FIG. 13 is a schematic flow diagram 1300 for a method of modulating a signal using a doped colloidal nanostructure as an optical switch. In an operation 1305, doped, colloidal nanostructures are provided on a substrate. In an operation 1310, the doped, colloidal nanostructures are switched from a first light absorption level to a second light absorption level by exposing the doped, colloidal nanostructures to light of a first resonance wavelength. In other words, the doped, colloidal nanostructures are exposed to a beam of the first resonance wavelength to elicit a plasmonic response. In an operation 1315, the doped, colloidal nanostructures modulate, as a result of the switching, light of a second wavelength passing through the doped, colloidal nanostructures. In other words, the first resonance wavelength controls the switch to modulate or switch light of a second wavelength that either can or cannot pass through the switch, depending on how it is tuned.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An article of manufacture comprising doped, colloidal nanostructures that are configured to have a plasmonic response to light of a first resonance wavelength, wherein the doped, colloidal nanostructures are dispersed in a solution deposited on a flexible surface, and wherein the doped, colloidal nanostructures comprise an optical switch that, in response to an absence of light at the first resonance wavelength, has a first light absorption level and, in response to a presence of light at the first resonance wavelength, has a different second light absorption level.

2. The article of manufacture of claim 1, wherein the doped, colloidal nanostructure is doped with aliovalent dopants.

3. The article of manufacture of claim 2, wherein the doped, colloidal nanostructures comprise zinc oxide (ZnO) nanostructures.

4. The article of manufacture of claim 3, wherein the doped, colloidal nanostructures are doped with at least one of aluminum, gallium, and indium.

5. The article of manufacture of claim 2, wherein the doped, colloidal nanostructures comprise indium oxide ($In_2O_3$) nanostructures.

6. The article of manufacture of claim 5, wherein the doped, colloidal nanostructures are doped with at least one of tin and antimony.

7. The article of manufacture of claim 2, wherein the doped, colloidal nanostructures comprise cadmium oxide (CdO) nanostructures.

8. The article of manufacture of claim 7, wherein the doped, colloidal nanostructures are doped with at least one of tin, aluminum, gallium, indium, and fluorine.

9. The article of manufacture of claim 1, wherein the optical switch is configured to switch between the first light absorption level and the second light absorption level in less than 1 picoseconds (ps).

* * * * *